(12) United States Patent
Lipman et al.

(10) Patent No.: US 6,689,985 B2
(45) Date of Patent: Feb. 10, 2004

(54) LASER DRILL FOR USE IN ELECTRICAL CIRCUIT FABRICATION

(75) Inventors: Eliezer Lipman, Rishon Lezion (IL); Yehiam Prior, Rehovot (IL); Abraham Gross, Ramat Aviv (IL)

(73) Assignee: Orbotech, Ltd., Yavne (IL)

( * ) Notice: Subject to any disclaimer, the term of this patent is extended or adjusted under 35 U.S.C. 154(b) by 25 days.

(21) Appl. No.: 10/032,061

(22) Filed: Dec. 31, 2001

(65) Prior Publication Data
US 2002/0092833 A1 Jul. 18, 2002

Related U.S. Application Data
(60) Provisional application No. 60/261,827, filed on Jan. 17, 2001.

(51) Int. Cl.$^7$ .............................................. B23K 26/00
(52) U.S. Cl. ................................ 219/121.7; 219/121.71
(58) Field of Search ........................ 219/121.7, 121.71, 219/121.67, 121.68, 121.69, 121.72, 121.85

(56) References Cited

U.S. PATENT DOCUMENTS

| | | | |
|---|---|---|---|
| 4,220,842 A | 9/1980 | Stürmer et al. ...... 219/121 LM |
| 4,553,017 A | 11/1985 | Addleman ............ 219/121 LA |
| 4,672,621 A | 6/1987 | Morita et al. ................. 372/58 |
| 4,838,631 A | 6/1989 | Chande et al. ............... 350/6.6 |
| 4,965,780 A | * 10/1990 | Lee et al. ..................... 369/13 |
| 5,005,969 A | 4/1991 | Kataoka ...................... 353/122 |
| 5,055,653 A | 10/1991 | Funami et al. ......... 219/121.75 |
| 5,144,630 A | * 9/1992 | Lin .............................. 372/22 |
| 5,164,565 A | * 11/1992 | Addiego et al. ........ 219/121.68 |
| 5,294,567 A | 3/1994 | Dorfman et al. ............. 437/187 |
| 5,517,000 A | 5/1996 | Nishiwaki et al. ...... 219/121.77 |
| 5,585,019 A | 12/1996 | Gu et al. ................ 219/121.73 |
| 5,593,606 A | * 1/1997 | Owen et al. ........... 219/121.71 |
| 5,614,114 A | 3/1997 | Owen .................... 219/121.66 |
| 5,674,414 A | 10/1997 | Schweizer ............. 219/121.77 |
| 5,676,866 A | 10/1997 | in den Bäumen et al. ..................... 219/121.77 |
| 5,690,845 A | 11/1997 | Fuse ..................... 219/121.74 |
| 5,731,047 A | * 3/1998 | Noddin ........................ 427/555 |
| 5,745,284 A | 4/1998 | Goldberg et al. ............ 359/344 |
| 5,841,099 A | * 11/1998 | Owen et al. ........... 219/121.69 |
| 5,841,102 A | 11/1998 | Noddin .................. 219/121.71 |
| 5,847,960 A | * 12/1998 | Cutler et al. ............ 364/474.29 |
| 5,933,216 A | 8/1999 | Dunn .......................... 355/53 |
| 5,973,290 A | 10/1999 | Noddin ..................... 219/121.7 |
| 6,058,132 A | 5/2000 | Iso et al. ..................... 372/108 |
| 6,275,514 B1 | 8/2001 | Katzir et al. ................... 372/25 |

FOREIGN PATENT DOCUMENTS

| | | |
|---|---|---|
| WO | WO 98/27450 | 6/1998 |
| WO | WO 00/73013 | 12/2000 |

* cited by examiner

Primary Examiner—M. Alexandra Elve
(74) Attorney, Agent, or Firm—Sughrue Mion, PLLC

(57) ABSTRACT

A laser micromachining system improve the utilization of laser energy by using multiple spectral components or time-altered pulses.

18 Claims, 5 Drawing Sheets

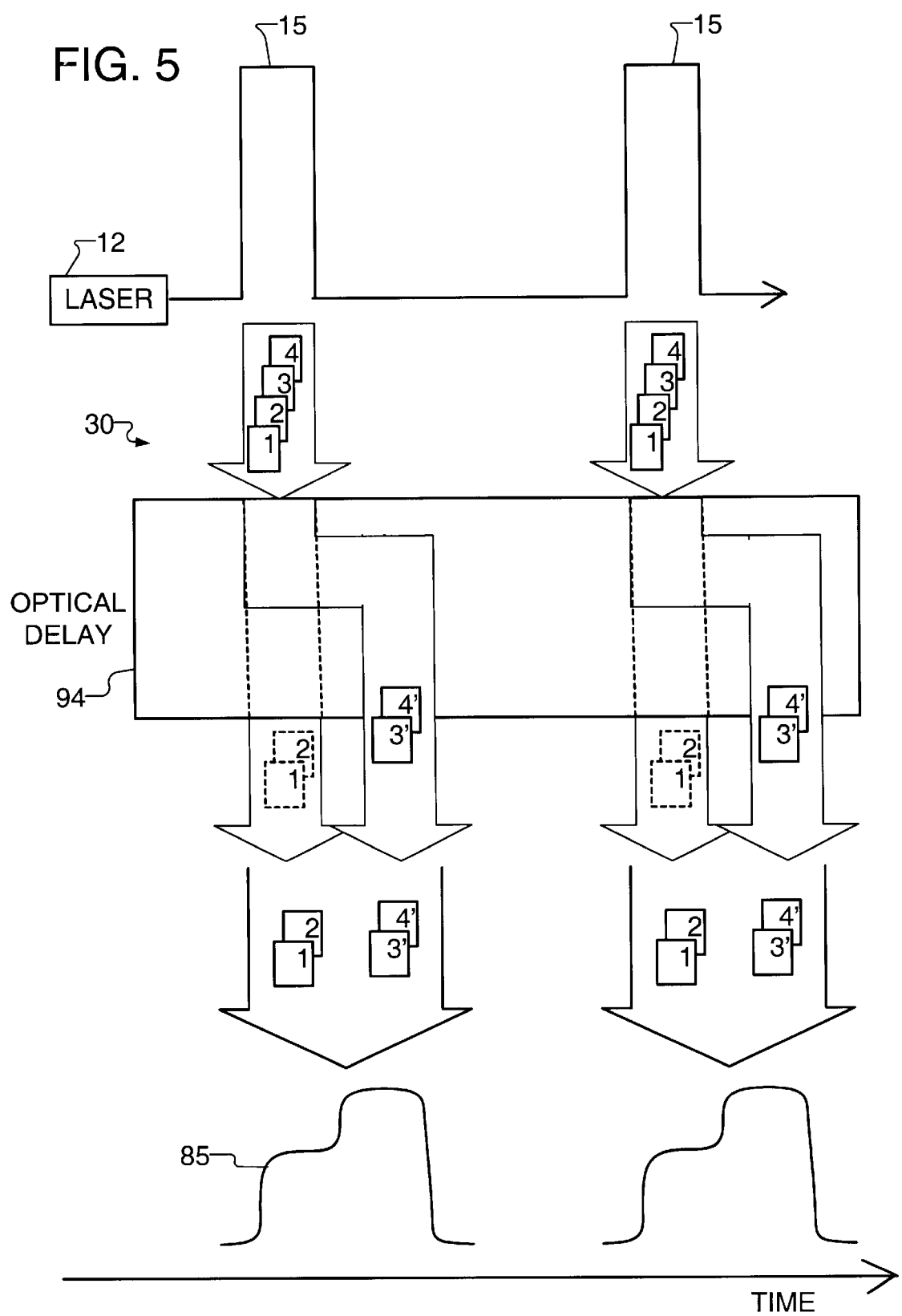

LASER DRILL FOR USE IN ELECTRICAL CIRCUIT FABRICATION

CROSS-REFERENCE TO RELATED APPLICATIONS

This application claims the benefit of U.S. Provisional Application No. 60/261,827, filed Jan. 17, 2001, which is incorporated by reference, herein, in its entirety.

FIELD OF THE INVENTION

The present invention relates to systems and methods for micromachining holes in objects such as electrical circuits, and, more particularly, to laser micromachining systems and methods which employ various laser sources simultaneously outputting more than one wavelength.

BACKGROUND OF THE INVENTION

It is known to use lasers to micromachine holes such as vias, micro vias, and blind micro vias, in electrical circuits such as printed circuit boards and interconnect chip packages.

Various materials forming electrical circuits react differently to laser beams in different spectral ranges. For example, various materials used in the manufacture of printed circuit boards have different power and energy requirements for removal by thermal interaction or ablation.

Generating a suitable laser beam driver for use in a laser micromachining system, such as a laser drill, includes generating a pulsed laser beam from a diode-pumped frequency-modified solid state laser. Typically, frequency modification, sometimes referred to as frequency conversion, is achieved by passing the beam through at least one non-linear crystal to generate one or more harmonics. All but one of the harmonic components are removed from the frequency-modified beam and discarded so as to result in a beam having a single desired wavelength.

SUMMARY OF THE INVENTION

A general aspect of the present invention relates to systems for improving the utilization of laser energy produced by frequency modified lasers, in the context of laser micromachining systems. A typical application for laser micromachining systems is drilling holes on electrical circuits, however the systems and methodologies described hereinbelow may be employed in any suitable laser machining and micromachining application.

One embodiment of the present invention relates to a laser micromachining system employing a pulsed laser which outputs a frequency modified laser beam having at least two spectral components. As used herein, a frequency modified, or frequency converted, laser beam means a laser beam whose spectral composition is modified by any suitable means to result in a laser beam having a different single wavelength component, or to have several wavelength components, for example by harmonic generation. Such a frequency modified laser beam optionally includes the fundamental wavelength component of an initially input laser beam.

Another embodiment of the invention relates to a method of laser micromachining employing a first pulse defined by a first spectral component, and then a second pulse defined by a second spectral component, each delivered to the same region of an object to be micro-machined.

Still another embodiment of the invention relates to a method of laser micromachining employing time-altered pulses. A time-altered pulse is a pulse formed of at least two pulse components in which at least one of the pulse components is time delayed such that the pulse duration and/or the time separation between the two pulse components is altered with respect to an initial pulse or sequence of pulses. The pulse components forming a time altered pulse are from different wavelength components. Optionally, they are from the same wavelength component.

The invention is taught below by way of various specific exemplary embodiments explained in detail, and illustrated in the enclosed drawing figures.

BRIEF DESCRIPTION OF THE DRAWINGS

The drawing figures depict, in highly simplified schematic form, embodiments reflecting the principles of the invention. Many items and details that will be readily understood by one familiar with this field have been omitted so as to avoid obscuring the invention. In the drawings:

FIG. 5 is a pictorial diagram of a system for producing the time-altered pulse shown in FIG. 4.

DETAILED DESCRIPTION

Figure 1:
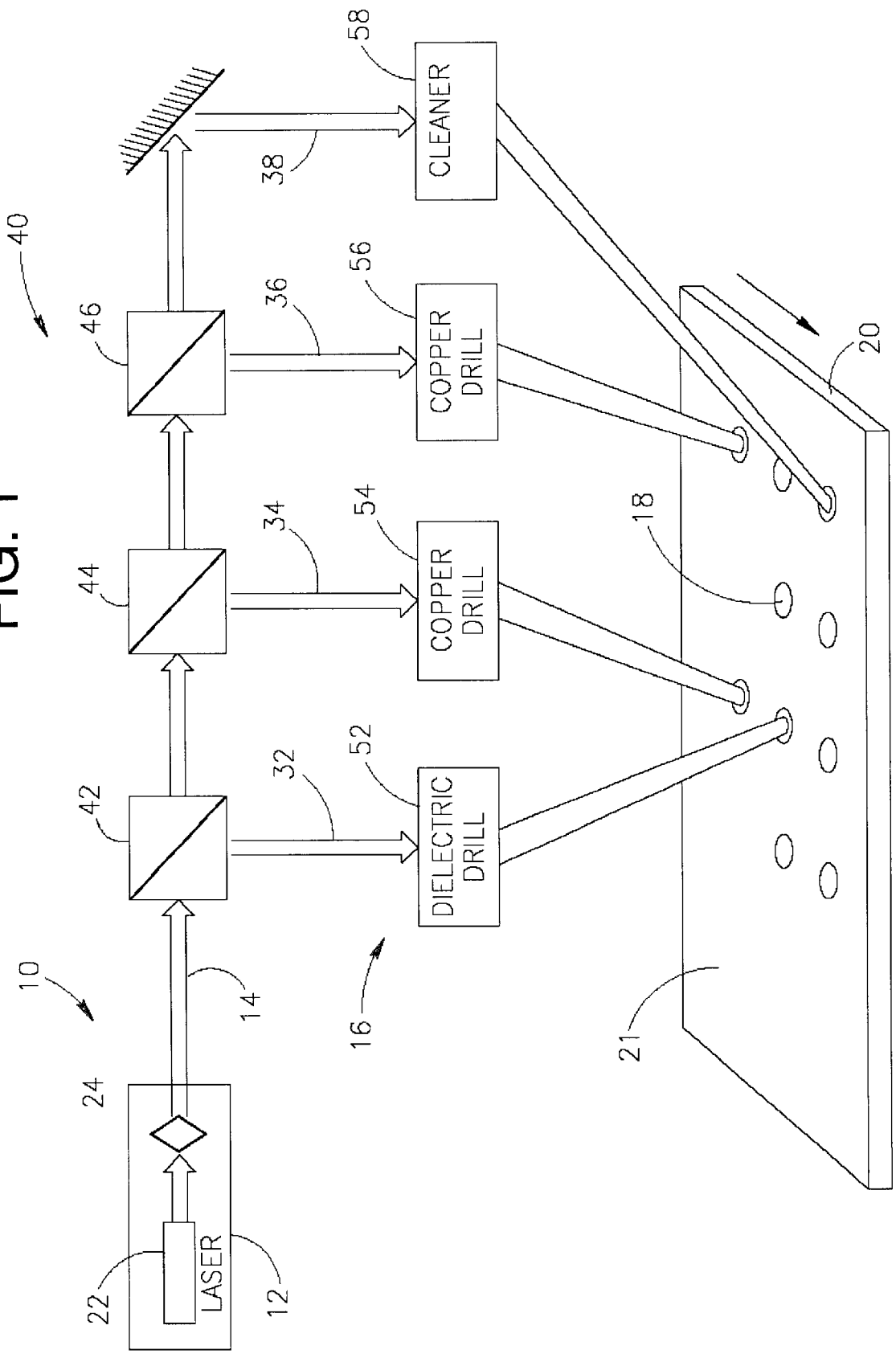
FIG. 1 is a simplified pictorial diagram of a laser drilling system constructed and operative in accordance with an embodiment of the present invention.

The invention will now be described using various exemplary embodiments. Although the embodiments are described in detail, it will be appreciated that the invention is not limited to just these embodiments, but has a scope that is significantly broader. The appended claims should be consulted to determine the true scope of the invention.

According to an embodiment of the invention, a laser beam having several spectral components is generated by passing a laser beam, typically a pulsed laser beam, through one or more non-linear crystals. The spectral components are harmonics of the initial laser beam. Each of the spectral components is generated and then employed to perform a part of a laser drilling or micromachining process for which it is particularly suited.

For example, in the context of a system for micromachining holes in electrical circuits, a spectral component in the vicinity of 1.064 µm is particularly suitable for laser micromachining dielectric substrates, but typically is not suitable for micromachining copper; spectral components in the vicinity of 0.532 and 0.355 µm are particularly suitable for opening holes in copper and may be used for micromachining dielectric substrate but have a tendency to damage copper layers located beneath the dielectric substrate; and low power spectral components in the vicinity of 0.266 µm are particularly suitable for micromachining glass and for cleaning debris that remains in laser drilled holes after completion of a laser micromachining processes. It is appreciated that in other applications, the spectral components resulting from frequency modification will suitable for different parts of a micromachining process at hand.

The laser micromachining system may include at least one dichroic beam splitter which receives the laser beam and diverts at least one of the harmonic components. The resulting spectrally separated beams may then be employed in the same or in separate laser micromachining units to perform drilling and micromachining functions for which they are most suited.

In accordance with an embodiment of the invention, an initial laser beam is generated by a diode pumped solid state laser, although any suitable methodology for producing a pulsed laser beam may be employed. The initial laser beam is passed through one or more non-linear crystals, to produce a beam having several harmonic spectral components. The non-linear crystals may be disposed either internal to or external to a laser cavity producing the laser beam.

In this particular embodiment, three or more dichroic beam splitters are arranged in cascade in order to separate each of four harmonic components in the laser beam. Suitable additional dichroic beam splitters or other suitable optical elements may be provided to ensure that each resulting separated beam has only the desired harmonic spectral component. Each of the resulting harmonic component laser beams is employed to drive a separate laser drill operative to perform a drilling function to which the harmonic component laser beam is suited.

Figure 2:
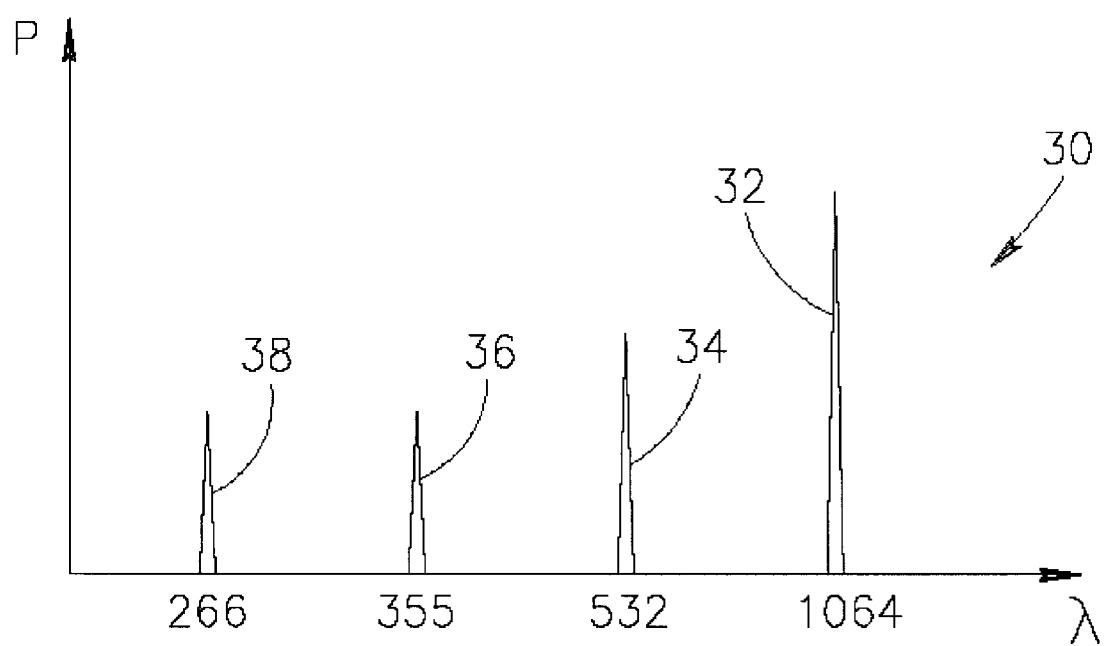
FIG. 2 is a simplified chart of energy levels of spectral components emitted by a laser in accordance with an embodiment of the present invention.

Reference is made to FIG. 1 which is a simplified pictorial diagram of a laser micromachining system 10 constructed and operative in accordance with an embodiment of the present invention, and to FIG. 2 which is a simplified chart of energy levels of spectral components of a laser beam employed in system 10.

Laser micromachining system 10 comprises a laser 12, producing a laser beam 14, and a plurality of laser micromachining units 16 each of which is operative to micromachine or drill holes 18, or parts of holes, such as vias and microvias, in an electrical circuit substrate 20 formed of a dielectric material and typically clad with layer of copper 21. Of course, copper is used here just as an example of a covering layer.

Preferably laser 12 comprises a laser cavity 22 and a laser wavelength conversion crystal 24, such as a non-linear crystal. A suitable non-linear crystal is a BBO or LBO crystal either of which is readily commercially available. Although FIG. 1 depicts laser wavelength conversion crystal 24 being disposed externally to laser cavity 22, it is appreciated that laser crystal 24 may be disposed inside laser cavity 22. In such configuration laser beam 14 produced by laser 12 comprises several harmonic components 30 (see FIG. 2), each having a different characteristic wavelength, as seen in greater detail in FIG. 2. Laser 12 may be a diode pumped frequency modified pulsed laser. One suitable example (among many) of such a laser is a solid state Q-switched laser from the AVIA family of diode pumped UV lasers, available from COHERENT of Santa Clara, Calif. It is appreciated that there are numerous examples of methodologies for modifying the frequency of laser beams, including, for example, Raman conversion and optical parametric oscillation. Harmonic conversion is but one example of a method for frequency modification, and any other suitable technique for modifying the frequency of a laser beam may be used in the context of the present invention.

As seen in FIG. 2, laser beam 14 produced by laser 12 and employed in the embodiment of FIG. 1 includes four harmonic components 32, 34, 36 and 38 respectively, which are characteristic of a laser beam produced by a diode pumped solid state laser and its second, third and fourth harmonic components. Components in beam 14 have wavelengths of approximately 1.064 $\mu$m, 0.532 $\mu$m, 0.355 $\mu$m and 0.266 $\mu$m respectively. It is noted that the power (plotted on the Y-axis) of each spectral component 30 may be reduced for each subsequent harmonic component.

Although FIG. 2 shows harmonic components 30 characteristically produced by a diode pumped solid state laser undergoing harmonic frequency modification, it is understood that other suitable lasers, with or without frequency modification, having several suitable spectral components, may be employed.

Returning to FIG. 1, system 10 includes at least one, and perhaps several, beam splitters 40. Beam splitters 40 may be dichroic beam splitters, polarizing beam splitters, or any other suitable beam component separators operative to separate desired and beam components from beam 14. As seen in FIG. 1, the beam splitters 40 separate the various spectral components from beam 14, and may be thought of together as a separation unit. In conventional solid state diode pumped lasers producing a UV laser beam, all of the spectral components that are produced except the desired UV component are discarded.

In particular, system 10 includes three beam splitters identified by reference numerals 42, 44, and 46 respectively. The number of beam splitters that are employed may be determined as a function of the number of harmonic components in laser beam 14 desired to be separated therefrom. It is appreciated that additional beam splitters, or other suitable spectral filters (not shown), may be employed to ensure that each of the resulting harmonic components 32, 34, 36 and 38 is characterized by a particular spectrum.

Beam splitter 42 diverts one harmonic component from beam 14. The harmonic component in this exemplary embodiment is component 32 having an ~1.064 $\mu$m wavelength. The beam splitter 42 directs the first harmonic component 32 to a dielectric laser micromachining unit typically including suitable beam focusing optics and beam directing mechanics (not shown). In FIG. 1, the laser micromachining unit is dielectric drill 52. This first harmonic component is particularly suitable, for example, for micromachining dielectric materials, but is less suitable, for example, for use in micromachining or opening holes in the covering layer (copper layer 21 in this example), and also is unsuitable for cleaning debris from holes 18, such as vias and micro vias, micromachined in an electrical circuit substrate 20.

It is appreciated by those familiar with this field that, because component 32 is typically considered to be a by-product of the laser frequency modification process, it is often discarded in conventional systems. In the present embodiment, however, this component is put to work.

Beam splitter 44 is operative to receive beam 14, after diversion of component 32, and to divert therefrom another harmonic component, such as component 34 having an ~0.532 $\mu$m wavelength. Beam splitter 44 directs component 34 to a copper drilling or micromachining unit, typically including suitable beam focusing optics and beam directing mechanics (not shown), seen in FIG. 1 as copper drill 54. The harmonic component 34 may be particularly suitable, for example, for micromachining copper.

Beam splitter 46 is operative to receive beam 14, after diversion of components 32 and 34 respectively, and to separate remaining spectral components, such as components 36 and 38 having ~0.355 $\mu$m and ~0.266 $\mu$m wavelengths respectively. Component 36 is particularly suitable, for example, for micromachining copper and is supplied to a copper drilling and micromachining unit, typically including suitable beam focusing optics and beam directing mechanics (not shown), seen in FIG. 1 as copper drill 56.

Component 38 is particularly suitable, for example, for micromachining glass and cleaning debris from holes 18 that have been micromachined, for example by ablating the debris remaining therein after drilling. Thus, harmonic component 38 is supplied to a laser cleaner 58, typically including suitable beam focusing optics and beam directing mechanics (not shown).

It is noted that while copper micromachining units 54 and 56 are shown as separate units, it may be desirable in accordance with design considerations to employ a single copper micromachining unit using a beam having both components 34 and 36 and including, for example, suitably chromatically corrected optics.

Figure 3:
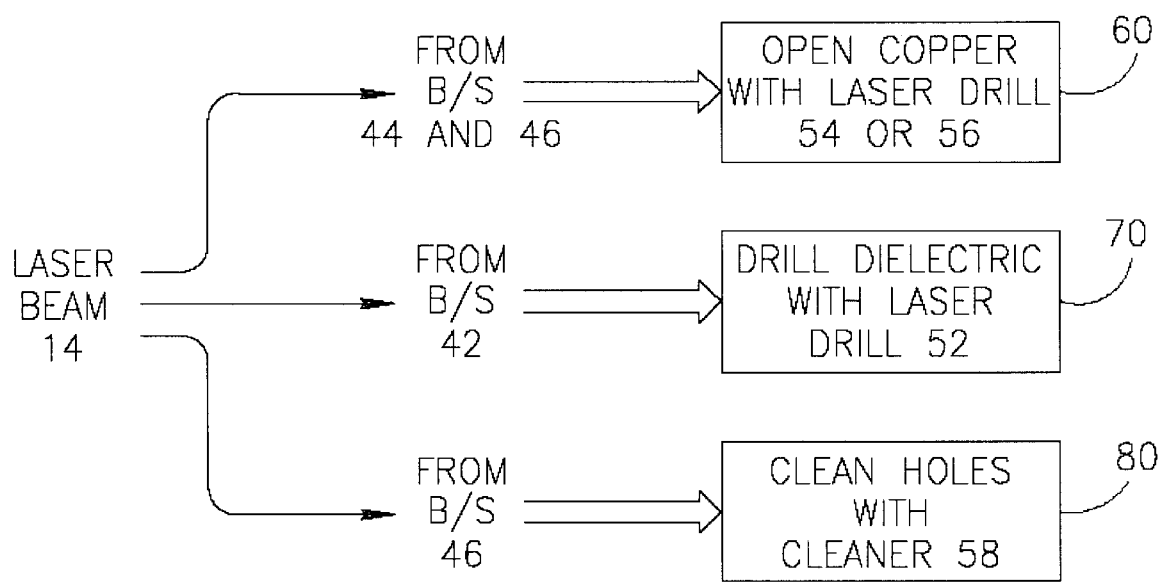
FIG. 3 is a simplified flow diagram of a laser drilling process employed by the system of FIG. 1.

Reference is now made to FIG. 3 which is a simplified flow diagram of a laser micromachining process employed by system 10 seen in FIG. 1. In the process shown in FIG. 3, in order to micromachine a hole 18, copper 21 from the upper layer is first opened with either of laser micromachining units 54 or 56 driven by harmonic components 34 and 36 derived from laser 12 (step 60). It is appreciated that a single laser micromachining unit (not shown) driven by both components 34 and 36 may be employed.

Once copper 21 is opened, the dielectric material forming substrate 20 is exposed, and the exposed dielectric is micromachined with dielectric micromachining unit 52 driven by harmonic component 32 received from laser 12 (step 70).

The resulting hole 18 may then be cleaned, for example, by cleaner 58 driven by harmonic component 38 derived from laser beam 14 (step 80).

It is appreciated that a suitable control circuit or control unit (not shown) is provided to ensure that each step in the micromachining process of a hole 18 in an electrical circuit substrate 20 is performed in the proper sequence by the appropriate drill head. Each of the steps may be performed by separate drill heads as shown, or by a single drill head receiving in series or in parallel each of the spectral component beams.

It is thus seen that a single frequency modified laser source may be employed to produce several beams, each of which is used for performing different functions in the via and microvia formation process. The resulting beams, respectively produced from harmonic spectral components of a frequency modified laser beam, each has a characteristic wavelength and power level.

Each harmonic component thus may be diverted to a suitable micromachining unit to perform part of a micromachining functionality that is most suited to the physical attributes of the harmonic component, thereby avoiding the discarding of spectral components which are the by-product of laser frequency modification, and thus optimizing use of energy inherent in laser beam 12 in the production of holes in an electrical circuit substrate.

The foregoing embodiment shows how to improve the utilization of the laser energy, in the context of a laser drilling system for drilling holes on electrical circuits. In particular, a pulsed laser outputs a beam having at least two spectral components, and both of these components are used to advantage in a machining operation on a given circuit board. In some applications a first pulse having a first spectral component is applied to drill a hole on an electrical circuit, and then a second pulse having a different spectral component is applied to the hole. Whereas conventional approaches for obtaining relatively short wavelength laser beams (e.g. UV) by means of frequency modification of relatively long wavelength laser beams (e.g. IR), discard all but a desired single component, the present invention is notable in one aspect by using more than one spectral component from the same frequency modified laser beam in a machining operation on the same circuit board, thus achieving higher laser energy utilization.

Figure 4:
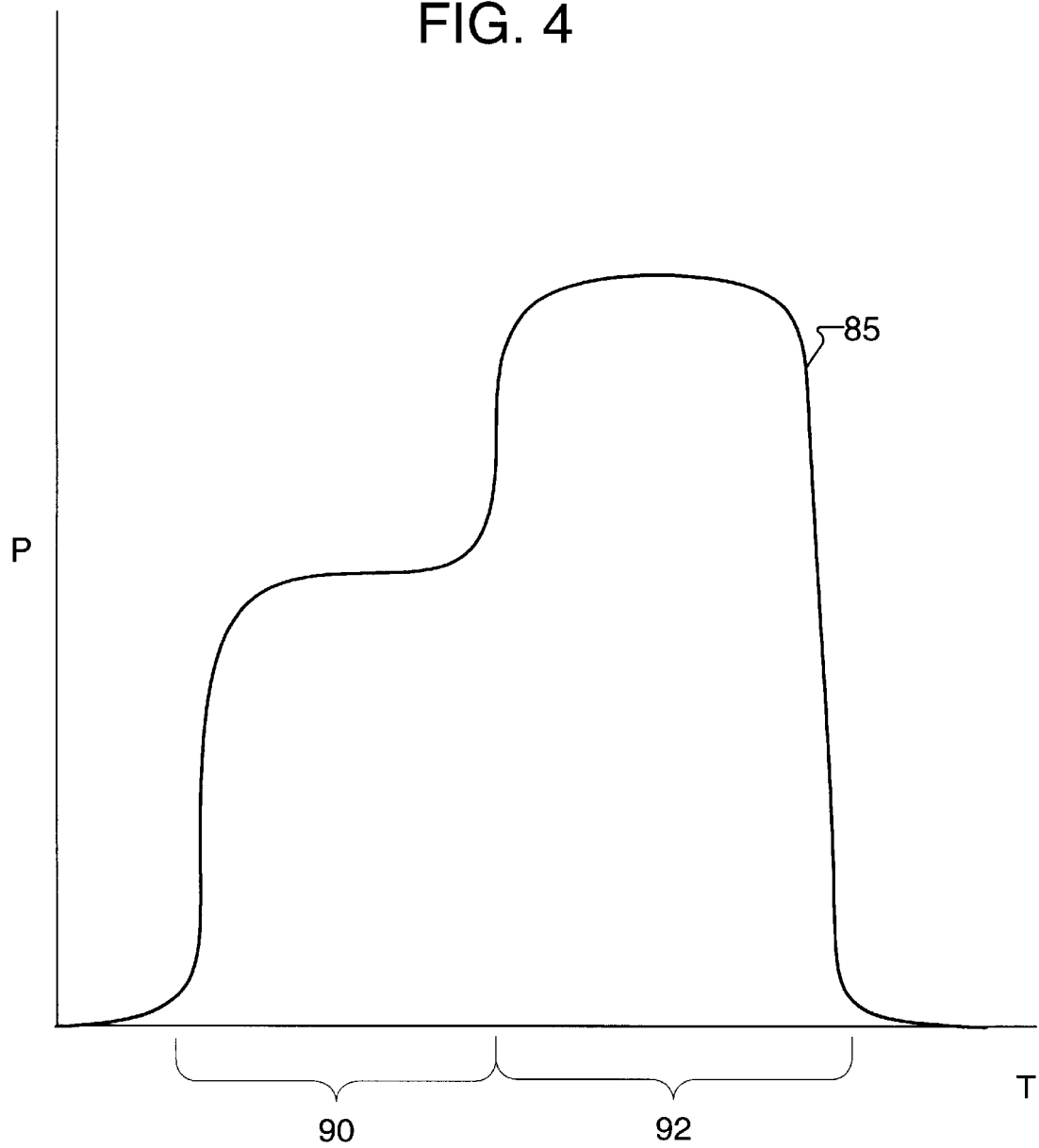
FIG. 4 is a simplified chart showing a time-altered pulse used in an embodiment of the invention.

Reference is made to FIGS. 4 and 5 which are, respectively, a simplified chart showing a time-altered pulse used in an embodiment of the invention, and a pictorial diagram of a system for producing the time-altered pulse. FIGS. 4 and 5 help explain another embodiment of the invention employing an initial relatively low powered and relatively high energy dose of laser energy to prepare a region in a copper coating for removal by a subsequent relatively higher power but lower energy dose of laser energy.

In some embodiments of the invention, the laser is a pulsed laser delivering laser pulses at a predetermined pulse rate. At least the initial dose of laser energy is time altered, that is it is passed through time delay circuitry so that it is delivered closer in time to a following pulse than would occur but for the delay. Here, too, improved laser energy utilization is advantageously achieved. FIG. 4 shows, in simplified form, a time-altered laser pulse 85. FIG. 5 shows, in pictorial form, one manner in which the time-altered laser pulse may be produced.

By way of introduction, the time-altered laser pulse may be provided to one or more micromachining units 16 for the purpose of performing a desired task in connection with the making of a hole 18 or the like. It is appreciated that although the time altered laser pulse is shown in the graph of FIG. 4 as being a single pulse, a time-altered pulse may be, in fact, formed of discrete pulses, each of which is delivered, one after the other, by a separate micromachining unit 16 aimed at the same location on substrate 20 (FIG. 1).

Pulsed laser 12 produces laser beam 14 in pulses 15 of laser energy in which each pulse contains all of the spectral components. In the system shown in FIG. 1, for example, each pulse 15 is separated into various spectral components 30 and each spectral component 30 is available during the duration of a pulse 15 for use in various machining operations. Each pulse 15 has a given duration, which may be thought of in the time domain as a pulse width, and is separated by a given time separation.

The exemplary pulse depicted in FIG. 4, however, has two parts. A first part 90 includes at least one spectral component 30. A second part 92 includes at least one spectral component 30. Optionally, the respective spectral components in first part 90 and second part 92 are different, This, however, need not be the case, for example when it is desired to lengthen a pulse duration. In FIG. 4, the relative heights and separation (or lack of separation) of the two parts 90 and 92 are arbitrary, and for the sake of illustration only. It is appreciated, for example, that the first part 90 and second part 92 may be discrete, although delivered closer in time than the given separation of non-delayed pulses.

A time-altered pulse 85 may be employed for any of the various machining tasks. For example, suppose it is desired to make an opening in the copper layer 21 and then continue to make an opening in the dielectric below copper layer 21.

In accordance with an embodiment of the invention, an initial laser energy dose is delivered to substrate 20 (FIG. 1). The initial laser energy dose is formed of one or more components 30 of the laser beam 14 as are necessary to prepare the copper, for example by generating a plasma, in or around a desired area, so as to facilitate removal by a subsequent laser dose. The initial dose, however, is provided at a power level that is insufficient to actually open or ablate the copper.

Subsequent to the initial laser dose, a follow-on laser dose is delivered to actually form the opening. The follow on dose is formed of such of the components 30 having sufficient energy and power to ablate the copper in the vicinity of the area prepared by the initial dose, for example in the vicinity of the area where a plasma was generated. It is appreciated, that once the copper is suitably prepared, such as by plasma generation, by the initial laser dose, it may be more easily removed by the subsequent laser dose. In other words the subsequent laser dose may have a lower energy level and/or power level than would otherwise be required to ablate or remove the copper but for the initial preparation.

It is appreciated the time separation between an initial pulse and a later pulse in a pulsed laser beam is such that the affects of preparing a region of copper (e.g., by plasma generation with a relatively high energy and relatively low power spectral component) for subsequent removal using a lower energy and higher power spectral component is lost between pulses. Consequently, in accordance with an embodiment of the invention, pulsed spectral components of a laser beam are time altered such that a low energy and high power component is delayed relative to a high energy and low poser component in a pulse. This may be accomplished, for example, by passing some components through a suitable delay, such as an optical delay, operative to time delay a pulse component.

For the sake of this example, it is assumed that two spectral components are to be used for the first part 90 of the time-altered pulse 85, being an initial laser dose, and that two other spectral components are to be used for the second part 92, being a subsequent follow-on dose.

In the example of FIG. 5, the spectral components 30 of each pulse 15 are shown immediately below the pulse. Each pulse 15 has (in this example) four such components 30 identified as components 1, 2, 3, and 4 respectively. The component number 1, 2, 3, or 4 should not be equated with precisely the first through fourth harmonics shown in FIG. 2, but should be understood to be any component forming a pulse as may be desirable to achieve a machining task at hand.

FIG. 5, an optical delay 94 is shown. For each pulse 15, two of the components (3 and 4) are passed through the delay 94 forming delayed components (3' and 4' respectively). The other components (1 and 2) by-pass optical delay 94 and are not delayed.

A suitable optical delay may be achieved by passing the components to be delayed (components 3 and 4 in this example) through an opto-mechanical delay, such as an adaptation of the opto-mechanical delay shown and described with respect to a laser repetition rate multiplier in U.S. Pat. No. 6,275,514, the disclosure of which is incorporated by reference for its useful background on this topic. The delay is typically in the order of several nanoseconds, and may be controlled by changing the length of the optical path in optical delay 94.

The optical delay 94 introduces a delay time such that components 1 and 2 from a pulse 15, which are not delayed, are delivered to the surface of a substrate at a time momentarily preceding the delivery of delayed components 3' and 4'. Thus, the result of passing pulses through an optical delay 94 is to produce a pulse whose overall time duration which is longer than a pulse produced by laser 12. By delaying one or more components 30 from the pulse 15, a time-altered pulse 85 can be achieved.

It is appreciated that, although FIG. 5 shows imposition of a delay on some components of the same pulse 15, a delay may be imposed between pulses, for example using a suitably long optical delay (suitable for example for extremely high pulse repetition rate lasers) or using electronic delay circuitry associated with pulse-on-demand type lasers.

The delay is used in exemplary embodiments to allow the delivery of some of the spectral components 30 at a non-overlapping time. In some laser systems, the pulses 15 occur with a separation in time that would normally allow a plasma formed on copper to return dissipate prior to the delivery of a subsequent pulse. By virtue of the optical delay 94, two of spectral components 30 in first part 90 are delivered close in time, but not overlapping in time, to the other two spectral components in second part 92. The length of the delay may be controlled to ensure that the effect of forming a plasma using two harmonic components 30 in the first part 90 is not lost prior to subsequent deliver of other harmonic components 30 in the second part 92 It is appreciated that, for some combinations of laser systems and material to be ablated, the naturally occurring pulses may be close enough together so that the preparing effect, e.g. in generating a plasma on the copper, is not lost even absent an optical delay.

Because of the use of time-altered pulses 85, the energy and power requirements on the laser may be reduced. That is to say, the conventional approach is to use a laser with enough energy and power to create the opening with just a single spectral component. The single harmonic component thus has to have a sufficiently substantial level of both energy and power. The embodiment of the invention shown in FIGS. 4 and 5 can use a laser with less power because the opening is created using bifurcated laser pulses that are formed with an initial portion having relatively low power but high quantum energy and a subsequent portion having relatively low energy by high power. The initial high energy portion prepare a region to be micro-machined so that the effectiveness of the subsequent low energy portion is enhanced, that is the low energy portion is operative to remove more material than it would but for the preceding delivery of an initial high energy dose.

It will be understood that, in time-altered pulse 85, one or more spectral components are employed at a first time (i.e., in the first part 90), and are followed by one or more other spectral components at a second time (i.e., in the second part 92). The difference between the first and second times is less than the time between two consecutive pulses 15 from the laser 12.

Many variations to the above-identified embodiments are possible without departing from the scope and spirit of the invention. Possible variations have been presented throughout the foregoing discussion. Moreover, it will be appreciated that the time-altered pulse 85 may be constituted by more than two parts, and that there is no need to use precisely two spectral components in each or any of the parts. It will further be appreciated that the time-altered pulse 85 may have a first part 90 that is separated slightly in time from the second part 92. It will further be appreciated that the one or more delayed spectral components need not be delayed exactly as shown (i.e., to lengthen the time duration of a pulse) but may be delayed so as to occur at any arbitrary desired timing in accordance with a delay being employed. It will be still further appreciated that laser beam doses formed of spectral components 30 in first part 90 and second part 92 may each be supplied by separate micromachining units each addressing the same location or by a suitably optically corrected single micromachining unit.

One typical context in which the above system and methods may be used is in the manufacture of electrical circuits. Thus in accordance with embodiments of the invention, a substrate is clad with a metal conductor layer, for example copper. Holes are drilled in the metal layer, for example to form through holes, vias and/or blind vias using any of the laser micromachining embodiments described hereinabove.

Of course, the machining task need not be the opening of a hole 18 in a copper layer 21, but could be any machining task in any suitable object or material.

Combinations and subcombinations of the various embodiments described above will occur to those familiar with this field, without departing from the scope and spirit of the invention.

There is claimed:

1. A laser micromachining system, comprising:
   a pulsed laser outputting a frequency modified pulsed laser beam;
   a separation unit receiving the frequency modified pulsed laser beam and outputting at least two different spectral components of the frequency modified pulsed laser beam; and
   at least two micromachining units, each micromachining unit receiving one of the at least two different spectral components and each micromachining unit having a separate laser beam delivery system.

2. The laser micromachining system as set forth in claim 2, wherein the separation unit comprises a dichroic beam splitter.

3. The laser micromachining system as set forth in claim 1, wherein the separation unit comprises a polarizing beam splitter.

4. The laser micromachining system as set forth in claim 1, wherein the separation unit comprises three dichroic beam splitters.

5. The laser micromachining system as set forth in claim 1, wherein the separation unit comprises three polarizing beam splitters.

6. The laser micromachining system as set forth in claim 1, further comprising a control unit controlling the micromachining units.

7. The laser micromachining system as set forth in claim 6, wherein the separation unit comprises two or more beam splitters, and wherein the at least two different spectral components of the laser beam include:
   a first component suitable for opening a hole in a dielectric layer but not a covering layer; and
   a second component suitable for opening a hole in said covering layer; and
   an other component suitable for cleaning debris, but not for opening a hole in either of said dielectric layer and said covering layer.

8. The laser micromachining system as set forth in claim 7, wherein the control unit controls the micromachining units to perform:
   a drilling operation using the second component; and then
   a drilling operation using the first component.

9. The laser micromachining system as set forth in claim 8, wherein the control unit controls the micromachining units to perform, after the drilling operation using the first component, a debris cleaning operation using the other component.

10. A method for micromachining with a laser, comprising:
    outputting a laser beam having a laser beam frequency;
    modifying the laser beam frequency to produce a beam having at least two different spectral components; and
    separately using each of the at least two different spectral components for simultaneously performing different micromachining functions at different locations.

11. The method for micromachining as set forth in claim 10, wherein said separately using includes:
    forming an opening in a covering layer with a first spectral component; at a first location; and then
    forming an opening in a dielectric layer with a second spectral component at said first location.

12. The method for micromachining as set forth in claim 11, wherein:
    the modifying is performed so as to output a third different spectral laser beam component; and
    the separately using further includes cleaning debris with the third spectral laser beam component at said first location after said forming of an opening in said dielectric layer.

13. A laser micromachining system, comprising:
    a pulsed laser outputting a pulsed laser beam;
    a separation unit receiving the pulsed laser beam and outputting at least two different spectral components of the pulsed laser beam, including a first spectral component formed of a multiplicity of first spectral laser beam pulses and a second spectral component formed of a multiplicity of second spectral laser beam pulses;
    a delay unit delaying ones of said multiplicity of first spectral laser beam pulses relative to ones of said multiplicity of second spectral laser beam pulses to provide delayed first spectral laser beam pulses; and
    at least one micromachining unit delivering to a surface micromachining pulses that are formed of a delayed first spectral laser beam pulse and a second spectral laser beam pulse, said second spectral laser beam pulse being defined at a time momentarily preceding the delivery of a delayed first spectral laser beam pulse.

14. A method for micromachining with a laser, comprising:
    laser outputting a pulsed laser beam;
    separating the pulsed laser beam into at least two different spectral components including a first spectral component formed of a multiplicity of first spectral laser beam pulses and a second spectral component formed of a multiplicity of second spectral laser beam pulses;
    generating delayed first spectral laser beam pulses by delaying ones of said multiplicity of first spectral laser beam pulses relative to ones of said multiplicity of second spectral laser beam pulses; and
    delivering micromachining pulses to a surface, said micromachining pulses being formed of a delayed first spectral laser beam pulse and a second spectral laser bema pulse, said second spectral laser beam pulse being defined at a time momentarily preceding the delivery of a delayed first spectral laser beam pulse.

15. A method for manufacturing an electrical circuit, comprising:
    depositing a layer of metal on a substrate; and
    micromachining a multiplicity of holes in said metal and said substrate, said micromachining comprising:
    outputting a laser beam having a first frequency;
    modifying the laser beam to produce at least two different spectral laser beam components; and
    separately using each of the at least two different spectral laser beam components for simultaneously performing different micromachining functions at different locations.

16. A method for manufacturing an electrical circuit, comprising:

depositing a layer of metal on a substrate; and micromachining a multiplicity of holes in said substrate, said micromachining comprising:

outputting a pulsed laser beam;

separating the pulsed laser beam into at least two different spectral components including a first spectral component formed of a multiplicity of first spectral laser beam pulses and a second spectral component formed of a multiplicity of second spectral laser beam pulses;

generating delayed first spectral laser beam pulses by delaying ones of said multiplicity of first spectral laser beam pulses relative to ones of said multiplicity of second spectral laser beam pulses; and delivering micromachining pulses to a surface, said micromachining pulses being formed of a delayed first spectral laser beam pulse and a second spectral laser beam pulse, said second spectral laser beam pulse being defined at a time momentarily preceding the delivery of a delayed first spectral laser beam pulse.

17. The laser micromachining system as set forth in claim 1, and wherein said at least two micromachining units are operative to simultaneously perform a micromachining functionality using said at least two different spectral components.

18. The laser micromachining system as set forth in claim 1, wherein said micromachining units are operative to deliver different spectral components to a given location according to a sequence.

* * * * *